United States Patent [19]
Shaw

[11] Patent Number: 5,961,194
[45] Date of Patent: *Oct. 5, 1999

[54] RETRACTABLE HANDLE FOR TELECOMMUNICATIONS EQUIPMENT CABINET AND METHOD OF OPERATION THEREOF

[75] Inventor: Kevin G. Shaw, Garland, Tex.

[73] Assignee: Lucent Technologies Inc., Murray Hill, N.J.

[*] Notice: This patent is subject to a terminal disclaimer.

[21] Appl. No.: 09/003,738

[22] Filed: Jan. 7, 1998

[51] Int. Cl.⁶ .................................................. A47B 97/00
[52] U.S. Cl. ..................... 312/352; 312/257.1; 16/115; 220/763
[58] Field of Search ................................ 312/352, 332.1, 312/348.6, 326, 244; 16/111 R, 115; 220/770, 763, 752, 761, 762

[56] References Cited

U.S. PATENT DOCUMENTS

| | | | |
|---|---|---|---|
| 751,685 | 2/1904 | Sanford | 16/115 |
| 1,016,392 | 2/1912 | Boudrot | 16/115 |
| 1,472,508 | 10/1923 | Beckman | 16/115 |
| 2,621,980 | 12/1952 | Miller, Jr. | 16/115 X |
| 3,082,473 | 3/1963 | West | 220/763 X |
| 3,521,939 | 7/1970 | Fall et al. | 312/332.1 |
| 3,572,870 | 3/1971 | Marks | 16/115 X |
| 4,786,122 | 11/1988 | Nichoalds | 312/257.1 |
| 5,795,043 | 8/1998 | Johnson et al. | 312/257.1 X |

FOREIGN PATENT DOCUMENTS

| | | | |
|---|---|---|---|
| 689881 | 4/1965 | Italy | 16/115 |
| 291616 | 6/1928 | United Kingdom | 16/115 |

OTHER PUBLICATIONS

McMaster–Carr Supply Company, Catalog, pp. 974–975, Dec. 1992.

*Primary Examiner*—Peter M. Cuomo
*Assistant Examiner*—James O. Hansen

[57] ABSTRACT

For use with a cabinet having a door, a retractable handle and a method of operating the same. In one embodiment, the retractable handle includes: (1) a handle grip having first and second extensions projecting therefrom and passing through corresponding first and second apertures in the door and (2) a spring structure, coupling the first and second extensions to the door, that bears against the first and second extensions to urge the handle grip toward a retracted position and, when the handle grip is subjected to a pulling force, compresses to allow the handle grip to move toward an extended position.

17 Claims, 2 Drawing Sheets

RETRACTABLE HANDLE FOR TELECOMMUNICATIONS EQUIPMENT CABINET AND METHOD OF OPERATION THEREOF

TECHNICAL FIELD OF THE INVENTION

The present invention is directed, in general, to telecommunications equipment and, more specifically, to a retractable handle for a telecommunications equipment cabinet and a method of operating such handle to gain access to an interior of such cabinet.

BACKGROUND OF THE INVENTION

Throughout the world today there are innumerable pull devices which are used to open doors, drawers or cabinets. Classic pull devices include surface mounted knobs, handles or pulls of wide ranging functional or artistic designs. For the purpose of this discussion, all of the aforementioned will be referred to as handles and the application will be described as that of a door handle on an electronic cabinet. One skilled in the art will readily recognize that the invention in its broadest form is also applicable to drawers, component or tool boxes or many other storage devices.

The simplest of handles may be either a knob or D-shaped handle attached to the door by means of screwing directly to the door face or with screw(s) penetrating from the rear door face and connecting to the handle. The handle may employ internal threads which are engaged by machine screws from the rear face of the door. Alternatively, the handle may employ one or more threaded shafts which penetrates and is attached to the door face with a corresponding number of threaded nuts. These handles typically project from the door face and may constitute an obstruction hazard. The hazard may cause operator injury or result in damage to the handle. The hazard is usually minimized, but not totally eliminated, by rounding the shape of the handle. In the case of small doors/drawers, the extended nature of these handles also effectively blocks some portion of the door/drawer face. Therefore, where it is desired to emblazon a manufacturer's logo or other label on the door, e.g., a faceplate, these handles may obscure part or all of the label.

In some applications, limited floor space may dictate the overall depth of a cabinet. For example, safety may require an aisle or access space of a minimum width in front of the cabinet. In the case of the classic handle which protrudes from the cabinet door, this protrusion depth must be added to the actual cabinet depth to determine the overall depth, and subsequently the effective aisle width. Thus valuable floor space across the entire width of the cabinet is sacrificed merely because the handle protrudes 1 to 2 inches at one location.

To truly minimize the obstruction hazard, recessed (flush mounted) handles have been developed. These handles take the form of a ring or D-shaped handle which is hinged and spring loaded or gravity operated to the retracted (recessed) position. Operating the handle involves inserting one or more fingers in the recess under the handle and withdrawing the handle to the extended position. These handles are much more mechanically involved than the simple handle, and therefore are more expensive to manufacture. Recessing the door face is required to make room for the handle mechanism when installing a recessed handle. This is a much more involved process than installing a simple handle. Recessed handles consume an even greater area of the door face than the simple handles described above, thus making even less area available for the faceplate with a manufacturer's logo or label. When planning a cabinet installation in a small room, a projecting handle must be included in the footprint of the cabinet. With a retractable or recessed handle, the cabinet can be made deeper for the same overall footprint.

Accordingly, what is needed in the art is a retractable handle which minimizes the obstruction hazard, is simple and low in cost to manufacture and install, and minimizes surface obstruction of the drawer face when retracted.

SUMMARY OF THE INVENTION

To address the above-discussed deficiencies of the prior art, the present invention provides, for use with a cabinet having a door, a retractable handle and a method of operating the same. In one embodiment, the retractable handle includes: (1) a handle grip having first and second extensions projecting therefrom and passing through corresponding first and second apertures in the door and (2) a spring structure, coupling the first and second extensions to the door, that bears against the first and second extensions to urge the handle grip toward a retracted position and, when the handle grip is subjected to a pulling force, compresses to allow the handle grip to move toward an extended position.

The present invention therefore introduces a handle for a cabinet that retracts (translates rearwardly when the cabinet is in a normal operating orientation) to yield a cabinet that is either shallower overall or internally deeper, depending upon the needs of a particular application. Further, the retractable handle yields a cleaner appearance and, because it does not normally protrude significantly from the cabinet, is somewhat protected from collision and consequential bending.

In one embodiment of the present invention, the handle grip is substantially flush with a front surface of the door when the handle grip is in the retracted position. The door may be provided with a recess about the handle to allow a user to insert his fingers behind the handle grip to exert the pulling force. Alternatively, of course, the handle can simply protrude from the door in its retracted position.

In one embodiment of the present invention, the door has a faceplate with apertures corresponding to the first and second apertures, the first and second extensions further passing through the apertures of the faceplate. It may be advantageous to provide an attractive faceplate for the cabinet. Such is often done for telecommunications equipment cabinets. In an embodiment to be illustrated and described, the spring structure is located on a backside of the door. This removes the need for the faceplate to transmit the pulling force.

In one embodiment of the present invention, the spring structure comprises first and second compression springs disposed about the first and second extensions, respectively, and captured to prevent the first and second compression springs from separating from the first and second extensions. Those skilled in the art will perceive other spring structures that employ one or more compressional, torsional or other type of spring to advantage.

In one embodiment of the present invention, the retractable handle further includes radial protrusions located about the first and second extensions that capture the first and second compression springs. In the embodiment to be illustrated and described, the radial protrusions take the form of washers coupled to the first and second extensions.

In one embodiment of the present invention, the handle grip has a rough surface thereon and a generally circular cross-section. A rough surface is simply one that enhances traction with a user's hand. Of course, a rough surface is not necessary. Likewise, the present invention contemplates other cross-sectional shapes for the handle grip and extensions.

In one embodiment of the present invention, the cabinet contains telecommunications equipment. Those skilled in the art will readily perceive, however, that the present invention can be employed in a wide range of cabinets.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
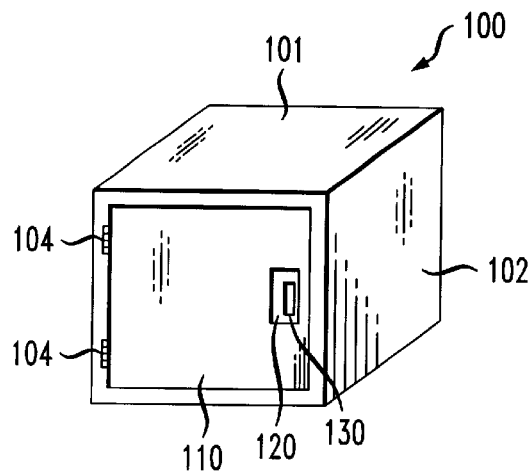
FIG. 1 illustrates an isometric view of an embodiment of a telecommunications cabinet with a front door and an exemplary retractable handle in the retracted position constructed according to the principles of the present invention.

Referring initially to FIG. 1, illustrated is an isometric view of an embodiment of a telecommunications cabinet with a front door and an exemplary retractable handle in the retracted position constructed according to the principles of the present invention. The telecommunications cabinet, generally designated 100, comprises a top 101, bottom (not shown), side 102 and rear walls (not shown), with a front opening door 110. The door 110 comprises a plurality of hinges 104, a faceplate 120 (optional), and a retractable handle 130 for opening the door 110.

Figure 2:
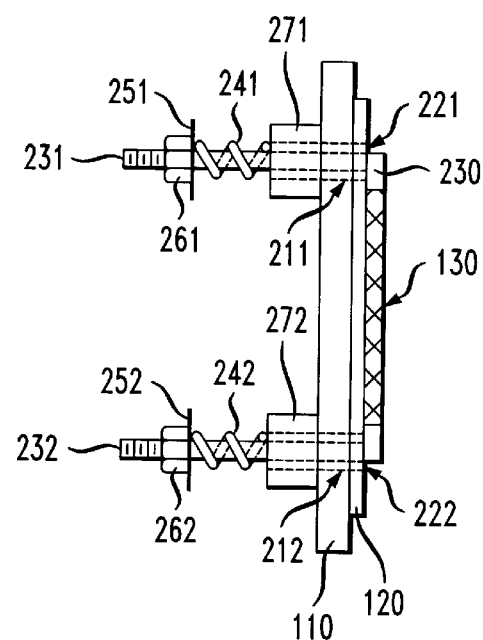
FIG. 2 illustrates a profile view of the retractable handle of FIG. 1 in the retracted position.

Referring now to FIG. 2, illustrated is a profile view of the retractable handle of FIG. 1 in the retracted position. The handle 130 comprises a handle grip 230 having first and second extensions 231, 232 projecting therefrom and passing through corresponding first and second apertures 211, 212 in the door 110. In the illustrated embodiment, the first and second extensions 231, 232 pass through corresponding first and second apertures 221, 222 in the faceplate 120 prior to passing through the corresponding first and second apertures 211, 212 in the door 110. However, those skilled in the art will readily understand that embodiments lacking a faceplate are clearly within the broadest scope of the current invention.

The handle 130 further comprises a spring structure consisting of two compression springs 241, 242 which couple the first and second extensions 231, 232 to the door 110. The first and second compression springs 241, 242, coiled about the first and second extensions 231, 232 respectively, are captured between first and second washers 251, 252 and the internal face of the cabinet door 110. In the illustrated embodiment, the compression springs 241, 242 rest on bushings 271, 272. The compression springs 241, 242, bushings 271, 272 and washers 251, 252 are held in place by nuts 261, 262. The compression springs 241, 242 bearing upon the washers 251, 252 and the internal face of the door 110, by way of the bushings 271, 272, combine to urge the handle grip 230 toward the retracted position. The handle grip 230 when retracted rests upon the outer face of the door 110, or more specifically in the illustrated embodiment, upon the surface of the faceplate 120, limiting the obstruction hazard to the thickness of the handle grip 230. However, one skilled in the art will recognize that alternative embodiments incorporating finger and/or handle recesses in the face of the door 110 are within the broadest scope of the present invention.

Figure 3:
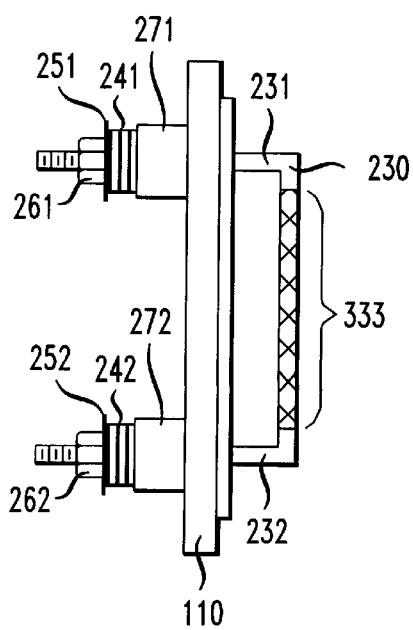
FIG. 3 illustrates a profile view of the retractable handle of FIG. 1 in the extended position.

Referring now to FIG. 3, illustrated is a profile view of the retractable handle of FIG. 1 in the extended position. In general, when the handle grip 230 is grasped and subjected to a pulling force, a spring structure 241, 242 compresses to allow the handle grip 230 to move toward an extended position. In the illustrated embodiment, when the handle grip 230 is fully extended the springs 241, 242 are fully compressed between the washers 251, 252 and the bushings 271, 272. In the extended position, opening force is transmitted, in turn, from the handle grip 230 to the nuts 261, 262, the washers 251, 252, the springs 241, 242, the bushings 271, 272 and the door 110, opening the door 110. The compression springs 241, 242 are retained about the first and second extensions 231, 232 when the handle 130 is in the extended position.

In the illustrated embodiment, the handle grip 230 is generally circular in cross section. However, one skilled in the art will readily recognize that the cross section of the handle grip 230 may be manufactured with any of a wide variety of shapes and remain within the broadest scope of the present invention. In an alternative embodiment, the handle grip 230 and first and second extensions 231, 232 may be of different cross sections, e.g., the handle grip 230 being rectangular and the extensions 231, 232 being circular.

In the illustrated embodiment, the surface of the handle grip 230 is rough 333. This facilitates grasping the handle grip 230 both during extension and while opening the door 110. However, one skilled in the art will understand that the handle grip 230 may also be constructed with a smooth or other surface without departing from the scope and intent of the present invention.

Figure 4:
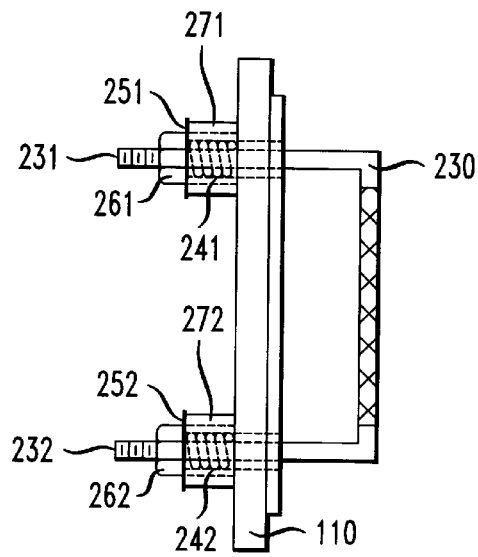
FIG. 4 illustrates a profile view of an alternative embodiment of the retractable handle of FIG. 2 in the extended position.

Referring now to FIG. 4, illustrated is a profile view of an alternative embodiment of the retractable handle of FIG. 2 in the extended position. In the illustrated embodiment, the compression springs 241, 242 rest within bushings 271, 272. The compression springs 241, 242, bushings 271, 272 and washers 251, 252 are held in place by nuts 261, 262. The compression springs 241, 242 bearing upon the washers 251, 252 and the internal face of the door 110 combine to urge the handle grip 230 toward the retracted position. In the illustrated embodiment, the springs 241, 242 compress until the washers 251, 252 contact the face of the bushings 271, 272. In the extended position, opening force is transmitted, in turn, from the handle grip 230 to the nuts 261, 262, the washers 251, 252, the bushings 271, 272 and the door 110, opening the door 110. The compression springs 241, 242 are retained about the first and second extensions 231, 232 and within the bushings 271, 272 when the handle 130 is in the extended position.

Figure 5A:
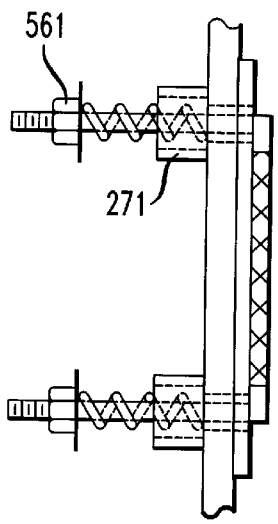
FIGS. 5A and 5B illustrates two alternative embodiments of the first and second extensions of FIG. 2.
Figure 5B:
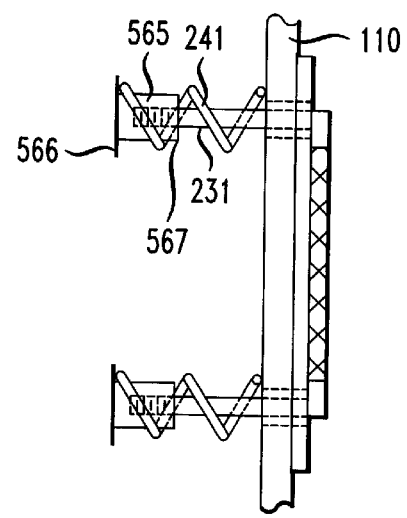

Referring now to FIGS. 5A and 5B, illustrated are two alternative embodiments of the first and second extensions of FIG. 2. FIG. 5A depicts a flange nut (an integrally formed nut and washer) 561 which replaces the nut 261 and washer 251 of FIG. 2. The washer portion of the flange nut 561 contacts the bushing 271 when the handle 130 is fully extended. FIG. 5B depicts a compression spring 241 captured about an externally threaded first extension 231 and between the first shoulder 566 of a mating double-shoulder nut 565 and the internal face of the door 110.

When the handle is extended, the second shoulder 567 of the double-shoulder nut 565 contacts the internal face of the door 110 before the spring 241 is fully compressed.

Those skilled in the art will readily recognize that other spring structures, combined with other bearing surfaces and capture devices (e.g. retaining nuts, cotter pins, snap rings, etc.), may be applied to the disclosed concept while remaining within the broadest scope and intent of the present invention.

Figure 6A:
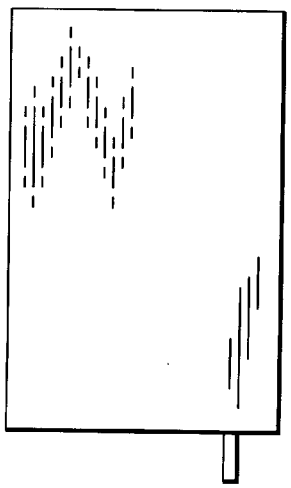
FIG. 6A illustrates a top view of a cabinet equipped with a projecting handle of the prior art.
Figure 6B:
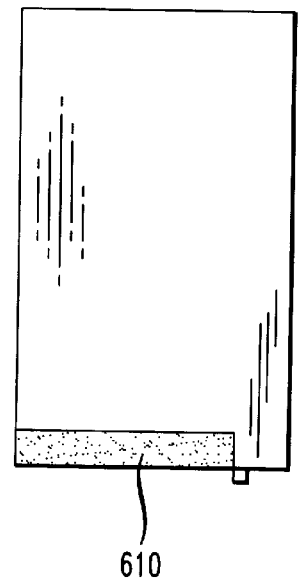
FIG. 6B illustrates a top view of a cabinet with the same footprint as the cabinet of FIG. 6A when constructed according to the principles of the present invention.

Referring now to FIG. 6A, illustrated is a top view of a cabinet equipped with a projecting handle of the prior art. Referring now to FIG. 6B, illustrated is a top view of a cabinet with the same footprint as the cabinet of FIG. 6A when constructed according to the principles of the present invention. Comparing now FIGS. 6A and 6B, one skilled in the art will recognize the advantage of increased cabinet space, designated 610, when a cabinet of the same footprint is equipped with the present invention. Thus depending upon the application, the cabinet may be shallower overall or possess more storage space when equipped with the present invention.

From the above, it is apparent that the present invention provides, for use with a cabinet having a door, a retractable handle and a method of operating the same. In one embodiment, the retractable handle includes: (1) a handle grip having first and second extensions projecting therefrom and passing through corresponding first and second apertures in the door and (2) a spring structure, coupling the first and second extensions to the door, that bears against the first and second extensions to urge the handle grip toward a retracted position and, when the handle grip is subjected to a pulling force, compresses to allow the handle grip to move toward an extended position.

Although the present invention has been described in detail, those skilled in the art should understand that they can make various changes, substitutions and alterations herein without departing from the spirit and scope of the invention in its broadest form.

What is claimed is:

1. A retractable handle for use with a cabinet door having first and second apertures therethrough, comprising:
    a handle grip having first and second extensions projecting therefrom, said first and second extensions having respective first and second free ends capable of passing through said first and second apertures respectively from an outer surface of said door;
    first and second compression springs radially disposed about said first and second extensions respectively;
    a first bushing radially disposed about said first extension and having a first hollow portion configured to contain said first compression spring therein, said first bushing effectively extending said first aperture, thereby to cause said first extension to remain substantially normal to said outer surface as a pulling force is applied to said handle grip, said first compression spring being contained within said first hollow portion when said handle grip is in an extended position;
    a second bushing radially disposed about said second extension and having a second hollow portion configured to contain said second compression spring therein, said second bushing effectively extending said second aperture, thereby to cause said second extension to remain substantially normal to said outer surface as a pulling force is applied to said handle grip, said second compression spring contained within said second hollow portion when said handle grip is in said extended position;
    a first spring retainer coupled to said first free end and restraining a second end of said first compression spring, said first compression spring bearing against said first extension and said first bushing; and
    a second spring retainer coupled to said second free end and restraining a second end of said second compression spring, said second compression spring bearing against said second extension and said second bushing, said first and second compression springs cooperating to urge said handle grip toward a retracted position and, when said handle grip is subjected to a pulling force, compressing to allow said handle grip to move toward an extended position.

2. The handle as recited in claim 1 wherein said handle grip is substantially flush with a front surface of said door when said handle grip is in said retracted position.

3. The handle as recited in claim 1 wherein said retractable handle further comprises a faceplate with apertures corresponding to said first and second apertures, said first and second free ends further capable of passing through said apertures of said faceplate.

4. The handle as recited in claim 1 wherein said first and second spring retainers comprise radial protrusions located about said first and second extensions that capture said first and second compression springs.

5. The handle as recited in claim 1 wherein said handle grip has a rough surface thereona nd a generally circular cross-section.

6. The handle as recited in claim 1 wherein said retractable handle is capable of opening said cabinet door when subjected to a pulling force thereby providing access to telecommunications equipment.

7. A method of gaining access to an interior of a cabinet having a door, comprising:
    subjecting a retractable handle grip to a pulling force, said handle grip having first and second extensions with first and second free ends projecting therefrom and capable of passing through corresponding first and second apertures in said door and through corresponding first and second bushings having first and second hollow portions configured to contain said first and second compression springs therein, respectively, when said handle grip is in an extended position, said first and second bushings radially disposed about said first and second extensions, respectively, said first and second bushings effectively extending said first and second apertures, respectively, thereby to cause said first and second extensions to remain substantially normal to an outer surface of said door as a pulling force is applied to said handle grip; and compressing first and second compression springs radially disposed about said first and second extensions and captured between first and second spring retainers, respectively, and said first and second bushings, respectively, to allow said handle grip to move toward an extended position.

8. The method as recited in claim 7 further comprising the step of grasping said handle grip when said handle grip is in said retracted position, said handle grip being substantially flush with a front surface of said door.

9. The method as recited in claim 7 wherein compressing further includes compressing said first and second compression springs behind a faceplate affixed to said door, said faceplate having apertures corresponding to said first and second apertures, said first and second free ends further passing through said apertures of said faceplate.

10. The method as recited in claim 7 wherein subjecting further includes subjecting a retractable handle grip having radial protrusions located about said first and second extensions that capture said first and second compression springs.

11. The method as recited in claim 7 wherein subjecting further includes subjecting a retractable handle grip having a rough surface thereon and a generally circular cross-section.

12. The method as recited in claim 7 wherein subjecting includes subjecting a retractable handle grip to a pulling force, said retractable handle grip capable of opening said cabinet, said cabinet containing telecommunications equipment.

13. A telecommunications equipment cabinet, comprising:

top, bottom, side and rear walls, coupled together to form a box with an open front for containing telecommunications equipment;

a door, hingedly mounted to one of said side walls, that closes to block said open front, said door having first and second apertures therethrough and a retractable handle to allow said door to be opened, said retractable handle including:

a handle grip having first and second extensions projecting therefrom, said first and second extensions having respective first and second free ends, respectively, capable of passing through said first and second apertures respectively from an outer surface of said door, first and second compression springs radially disposed about said first and second extensions respectively;

a first bushing radially disposed about said first extension and having a first hollow portion configured to contain said first compression spring therein, said first bushing effectively extending said first aperture, thereby to cause said first extension to remain substantially normal to said outer surface as a pulling force is applied to said handle grip, said first compression spring being contained within said first hollow portion when said handle grip is in an extended position;

a second bushing radially disposed about said second extension and having a second hollow portion configured to contain said second compression spring therein, said second bushing effectively extending said second aperture, thereby to cause said second extension to remain substantially normal to said outer surface as a pulling force is applied to said handle grip, said second compression spring being contained within said second hollow portion when said handle grip is in said extended position;

a first spring retainer coupled to said first free end and capturing a second end of said first compression spring, said first compression spring bearing against said first extension and said first bushing; and a second spring retainer coupled to said second free end and capturing a second end of said second compression spring, said second compression spring bearing against said second extension and said second bushing, said first and second compression springs cooperating to urge said handle grip toward a retracted position and, when said handle grip is subjected to a pulling force, compressing to allow said handle grip to move toward an extended position.

14. The cabinet as recited in claim 13 wherein said handle grip is substantially flush with a front surface of said door when said handle grip is in said retracted position.

15. The cabinet as recited in claim 13 wherein said door has a faceplate with apertures corresponding to said first and second apertures, said first and second extensions further passing through said apertures of said faceplate.

16. The cabinet as recited in claim 13 wherein said retractable handle further comprises radial protrusions located about said first and second extensions that capture said first and second compression springs.

17. The cabinet as recited in claim 13 wherein said handle grip has a rough surface thereon and a generally circular cross-section.

* * * * *